(12) United States Patent
Park et al.

(10) Patent No.: US 8,866,543 B2
(45) Date of Patent: Oct. 21, 2014

(54) INTEGRATED CIRCUIT HAVING STACK STRUCTURE

(71) Applicant: Soongsil University Research Consortium Techno-Park, Seoul (KR)

(72) Inventors: Chang Kun Park, Suwon-si (KR); Ho Yong Hwang, Gyeongsangnam-do (KR)

(73) Assignee: Soongsil University Research Consortium Techno-Park, Seoul (KR)

( * ) Notice: Subject to any disclaimer, the term of this patent is extended or adjusted under 35 U.S.C. 154(b) by 0 days.

(21) Appl. No.: 13/961,067

(22) Filed: Aug. 7, 2013

(65) Prior Publication Data

US 2014/0139271 A1   May 22, 2014

(30) Foreign Application Priority Data

Nov. 22, 2012   (KR) .......................... 10-2012-0132977

(51) Int. Cl.
*H01L 25/00* (2006.01)
*G05F 3/16* (2006.01)
*H01L 25/065* (2006.01)

(52) U.S. Cl.
CPC .............. *H01L 25/0657* (2013.01); *G05F 3/16* (2013.01)
USPC ............................ 327/564; 327/565; 257/686

(58) Field of Classification Search
USPC .................... 365/221, 230.1, 230.03, 230.05, 365/230.06; 257/685–686, 758, 781; 327/564–566
See application file for complete search history.

(56) References Cited

U.S. PATENT DOCUMENTS 7,768,114 B2 * 8/2010 Choi ............................. 257/686
7,872,341 B1 * 1/2011 Jang et al. .................... 257/686
8,223,523 B2 * 7/2012 Jin et al. ........................ 365/51

FOREIGN PATENT DOCUMENTS

KR   10-2009-0095003 A   9/2009

* cited by examiner

*Primary Examiner* — An Luu
(74) *Attorney, Agent, or Firm* — Sherr & Jiang, PLLC

(57) ABSTRACT

Provided is an integrated circuit (IC) having a stacked structure. The IC includes: a first IC having a power input terminal to which a power supply voltage is applied; and a second IC having a power input terminal connected to a ground terminal of the first IC, having a central node formed as the power input terminal of the second IC and the ground terminal of the first IC are connected to each other and to which a voltage is applied, and having a ground terminal connected to a ground source, wherein the power supply voltage is divided into first and second voltages that are respectively applied to the first and second ICs.

11 Claims, 3 Drawing Sheets

INTEGRATED CIRCUIT HAVING STACK STRUCTURE

CROSS-REFERENCE TO RELATED PATENT APPLICATION

This application claims the benefit of Korean Patent Application No. 10-2012-0132977, filed on Nov. 22, 2012, in the Korean Intellectual Property Office, the disclosure of which is incorporated herein in its entirety by reference.

BACKGROUND OF THE INVENTION

1. Field of the Invention

The present invention relates to an integrated circuit (IC) having a stacked structure, and more particularly, to an IC having a stacked structure, which has a less number of pads and is operable at a high power supply voltage by connecting ICs in a stacked structure.

2. Description of the Related Art

Generally, integrated circuits (ICs) are manufactured in an IC chip form. FIG. 1 is a diagram of general ICs 10 and 20. The ICs 10 and 20 correspond to a memory or a central processing unit (CPU).

As shown in FIG. 1, in order to mount the ICs 10 and 20 on a board, eight power supply pads and eight ground pads are required. However, the unit cost of production of such ICs 10 and 20 is high since many pads are required.

Also, recently, according to development of ICs, low power consumption has become an issue. Accordingly, an operating power supply voltage of the ICs is being decreased, but it is difficult for a designer to design an IC that operates at a low power supply voltage.

A background technology of the present invention is disclosed in KR 10-2009-0095003 (publication date; Sep. 9, 2009).

SUMMARY OF THE INVENTION

The present invention provides an integrated circuit (IC) having a stacked structure, which has a less number of pads and is operable at a high power supply voltage by connecting ICs in the stacked structure.

According to an aspect of the present invention, there is provided an integrated circuit (IC) having a stacked structure, the IC including: a first IC having a power input terminal to which a power supply voltage is applied; and a second IC having a power input terminal connected to a ground terminal of the first IC, having a central node formed as the power input terminal of the second IC and the ground terminal of the first IC are connected to each other and to which a voltage is applied, and having a ground terminal connected to a ground source, wherein the power supply voltage is divided into first and second voltages that are respectively applied to the first and second ICs.

The first and second voltages may be each a half of the power supply voltage.

The IC may further include first and second regulators that are respectively connected between the power input terminal of the first IC and the central node and between the power input terminal of the second IC and the central node, and control the first and second voltages to be respectively applied to the first and second ICs in a uniform size.

The first and second regulators may control the voltage applied to the central node to maintain a half size of the power supply voltage.

The first regulator may include: a first operational amplifier having an inverting terminal to which a first external voltage smaller than a half of the power supply voltage is applied, and a non-inverting terminal connected to the central node; and a PMOS type first transistor having a gate terminal connected to an output terminal of the first operational amplifier, a source terminal connected to the power input terminal of the first IC, and a drain terminal connected to the central node, and the second regulator may include: a second operational amplifier having an inverting terminal to which a second external voltage larger than the half of the power supply voltage is applied, and a non-inverting terminal connected to the central node; and an NMOS type second transistor having a gate terminal connected to an output terminal of the second operational amplifier, a source terminal connected to a ground terminal of the second IC, and a drain terminal connected to the central node.

When the voltage applied to the central node is smaller than the first external voltage, the first and second operational amplifiers may each output a low signal, the first and second transistors may be respectively turned on and turned off, and a size of the voltage applied to the central node may be increased as a channel is formed between the power input terminal of the first IC and the drain terminal of the first transistor.

When the voltage applied to the central node is higher than the second external voltage, the first and second operational amplifiers may each output a high signal, the first and second transistors may be respectively turned off and turned on, and a size of the voltage applied to the central node may be decreased as a channel is formed between the ground terminal of the second IC and the drain terminal of the second transistor.

The IC may further include a third regulator connected between the power input terminal of the first IC and the central node to control the first and second voltages to be respectively applied to the first and second ICs in a uniform size, and controlling the central node to maintain a target voltage higher than a half of the power supply voltage, wherein the third regulator may include: a third operational amplifier having an inverting terminal to which a third external voltage that is same as the target voltage is applied, and a non-inverting terminal connected to the central node; and a PMOS type third transistor having a gate terminal connected to an output terminal of the third operational amplifier, a source terminal connected to the power input terminal of the first IC, and a drain terminal connected to the central node.

The IC may further include a fourth regulator connected between the central node and the ground terminal of the second IC to control the first and second voltages to be respectively applied to the first and second ICs in a uniform size, and controlling the central node to maintain a target voltage smaller than a half of the power supply voltage, wherein the fourth regulator may include: a fourth operational amplifier having an inverting terminal to which a fourth external voltage that is same as the target voltage is applied, and a non-inverting terminal connected to the central node; and an NMOS type fourth transistor having a gate terminal connected to an output terminal of the fourth operational amplifier, a source terminal connected to the ground terminal of the second IC, and a drain terminal connected to the central node.

The IC may further include: a first capacitor disposed between the power input terminal of the first IC and the central node; a second capacitor disposed between the central node and the ground terminal of the second IC; and a third capacitor disposed between the power input terminal of the first IC and the ground terminal of the second IC.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described more fully with reference to the accompanying drawings, in which exemplary embodiments of the invention are shown.

Figure 2:
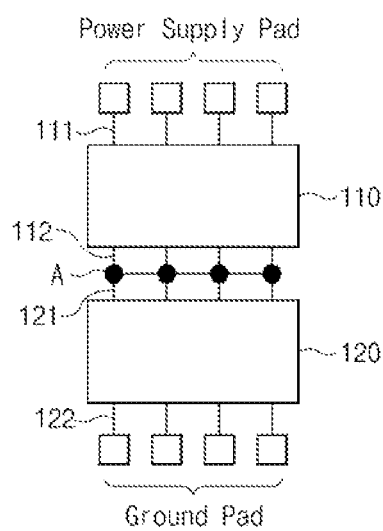
FIG. 2 is a diagram of first and second ICs having a stacked structure, according to an embodiment of the present invention.

FIG. 2 is a diagram of first and second integrated circuits (ICs) 110 and 120 having a stacked structure, according to an embodiment of the present invention. Referring to FIG. 2, the first and second ICs 110 and 120 are connected in the stacked structure. Here, the first and second ICs 110 and 120 respectively include four power input terminals 111 and four ground terminals 112, and four power input terminals 121 and four ground terminals 122.

A power supply voltage is applied to the power input terminal 111 of the first IC 110. In the second IC 120, the power input terminal 121 is connected to the ground terminal 112 of the first IC 110, and a voltage is applied to a central node A formed as the power input terminal 121 is connected to the ground terminal 112. The ground terminal 122 of the second IC 120 is connected to a ground source.

Here, the voltage applied to the central node A is a power supply voltage applied to the second IC 120, and in detail, the first and second ICs 110 and 120 are connected to each other in terms of voltages, and thus the power supply voltage is divided into the first and second ICs 110 and 120, but in reality, separate power supply voltages are applied to the first and second ICs 110 and 120.

Figure 3:
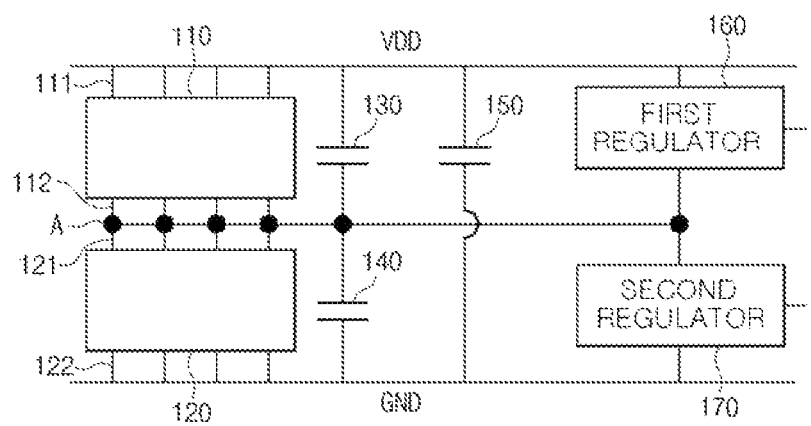
FIG. 3 is a diagram of first and second regulators added to the first and second ICs of FIG. 2.

In the current embodiment, the stacked structure means that the first and second ICS 110 and 120 are stacked on each other between a power supply voltage VDD and a ground source GND as in a circuit diagram, and does not but that the first and second ICs 110 and 120 are physically stacked on each other. Accordingly, when the first and second ICs 110 and 120 are realized on a board, the first and second ICs 110 and 120 are realized on the same plane as shown in FIG. 2 or 3.

Figure 1:
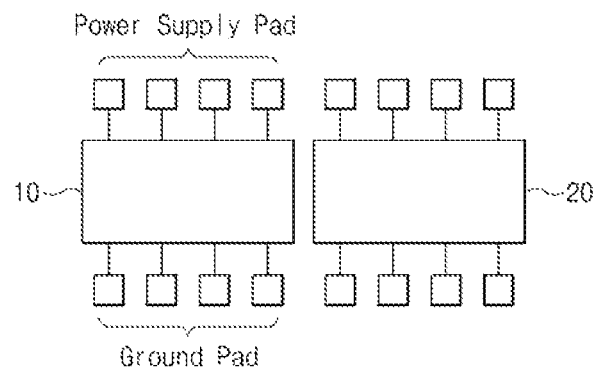
FIG. 1 is a diagram of general integrated circuits (ICs)

Referring to FIG. 2, the numbers of power supply pads 111 and 121 and ground pads 112 and 122 are theoretically halves of those of FIG. 1. For example, the numbers of the power supply pads and ground pads are each 8 in FIG. 1, whereas the numbers of power supply pads 111 and 121 and ground pads 112 and 122 are each 4 in FIG. 2.

In addition, the power supply voltage applied to the power input terminal 111 of the first IC 110 is divided into first and second voltages to be respectively applied to the first and second ICs 110 and 120. Here, the first and second voltages are each a half of the power supply voltage.

For example, in FIG. 1, when a power supply voltage of 3 V is applied to the power supply pads of the ICs 10 and 20, the ICs 10 and 20 both operate at 3 V. On the other hand, in FIG. 2, when the power supply voltage of 3 V is applied to the power input terminals 111 of the first IC 110, 3 V is divided into 1.5 V and 1.5 V and 1.5 V is applied to each of the first and second ICs 110 and 120. Accordingly, the first and second ICs 110 and 120 operate at 1.5 V, not 3 V.

In other words, according to the current embodiment, halves of the power supply voltage are respectively applied to the first and second ICs 110 and 120 even when the power supply voltage is high, and thus an effect as if the first and second ICs 110 and 120 operate at a low power supply voltage may be obtained and power consumption may be reduced.

Ideally, 1.5 V is applied to each of the first and second ICs 110 and 120, but in reality, a voltage is not constant and may fluctuate due to several variables. Thus, according to one or more embodiments of the present invention, first and second regulators 160 and 170 are added to the first and second ICs 110 and 120 FIG. 2.

FIG. 3 is a diagram of the first and second regulators 160 and 170 added to the first and second ICs 110 and 120 of FIG. 2. As described above, it is difficult to always uniformly maintain a power supply voltage according to operational situations of the first and second ICs 110 and 120 of FIG. 2, but in FIG. 3, a uniform voltage may be maintained by combining the first and second regulators respectively to the first and second ICs. In addition, a stable voltage from which ripples are removed may be distributed to each of the first and second ICs 110 and 120 by using first through third capacitors 130 through 150.

Here, the first capacitor 130 is disposed between the power input terminal 111 (the power supply voltage VDD) of the first IC 110 and the central node A. The second capacitor 140 is disposed between the central node A and the ground terminal 122 (the ground source GND) of the second IC 120. Also, the third capacitor 150 is disposed between the power input terminal 111 (the power supply voltage VDD) of the first IC 110 and the ground terminal 122 (the ground source GND) of the second IC 120.

Also, the first regulator 160 is connected between the power input terminal 111 (the power supply voltage VDD) of the first IC 110 and the central node A. The second regulator 170 is connected between the central node A and the ground terminal 122 (the ground source GND) of the second IC 120. An external voltage is applied to each of right terminals of the first and second regulators 160 and 170.

The first and second regulators 160 and 170 control the first and second voltages to be respectively applied to the first and second ICs 110 and 120 in a uniform size. In detail, the first and second regulators 160 and 170 control the voltage applied to the central node A to maintain a half size of the power supply voltage VDD.

Figure 4:
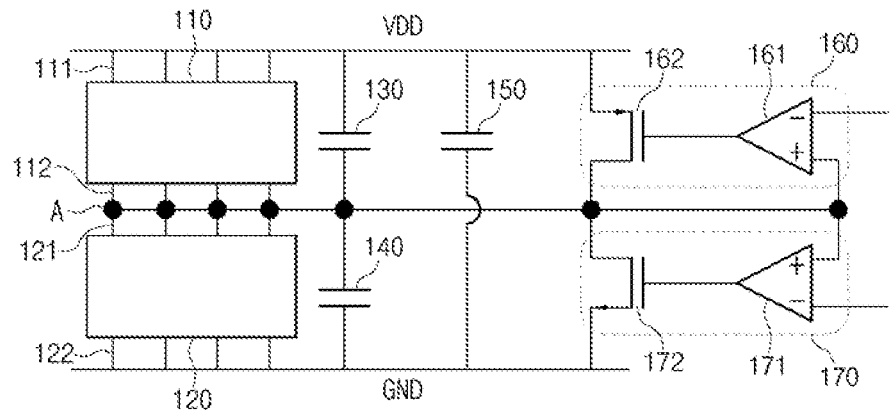
FIG. 4 is a detailed diagram of FIG. 3.

FIG. 4 is a detailed diagram of FIG. 3. In other words, the first and second regulators 160 and 170 of FIG. 3 are illustrated in detail in FIG. 4. The first and second regulators 160 and 170 include first and second operational amplifiers 161 and 171 operating as a comparator and first and second transistors 162 and 172 operating as an inverter.

First, the first regulator 160 includes the first operational amplifier 161 and the first transistor 162. In the first operational amplifier 161, a first external voltage (for example, 1.4 V) smaller than a half (for example, 1.5 V) of the power supply voltage (for example, 3 V) is applied to an inverting terminal −, and a non-inverting terminal + is connected to the central node A.

The first transistor 162 is a PMOS type, has a gate terminal connected to an output terminal of the first operational amplifier 161, has a source terminal connected to the power input terminal 111 (the power supply voltage VDD) of the first IC 110, and has a drain terminal connected to the central node A.

The second regulator 170 includes the second operational amplifier 171 and the second transistor 172. In the second operational amplifier 171, a second external voltage (for example, 1.6 V) higher than the half (for example, 1.5 V) of the power supply voltage (for example, 3 V) is applied to an inverting terminal −, and a non-inverting terminal + is connected to the central node A.

The second transistor 172 is an NMOS type, has a gate terminal connected to an output terminal of the second operational amplifier 171, has a source terminal connected to the ground terminal 122 (the ground source GND) of the second IC 120, and has a drain terminal connected to the central node A.

Internal operations of the first and second regulators 160 and 170 will now be described in detail. For convenience of description, it is assumed that the power supply voltage VDD is 3 V, the first external voltage applied to the first operational amplifier 161 is 1.4 V, and the second external voltage applied to the second operational amplifier 171 is 1.6 V.

The first and second operational amplifiers 161 and 171 output a high signal when a voltage input to the non-inverting terminal + is higher than a voltage input to the inverting terminal −, and outputs a low signal when the voltage input to the non-inverting terminal + is lower than the voltage input to the inverting terminal −. Table 1 below shows output values of the first and second amplifiers 161 and 171 of FIG. 4.

TABLE 1

|  | Output of First Operational Amplifier 161 | Output of Second Operational Amplifier 171 |
| --- | --- | --- |
| Voltage of Central Node A <1.4 V | Low | Low |
| Voltage of Central Node A = 1.5 V | High | Low |
| Voltage of Central Node A >1.6 V | High | High |

Also, since the first transistor 162 is a PMOS type, the first transistor 162 is turned off when a high signal is input and is turned on when a low signal is input. Since the second transistor 172 is an NMOS type, the second transistor 172 is turned on when a high signal is input and is turned off when a low signal is input. Operations of the first and second transistors 162 and 172 are shown in Table 2 below.

TABLE 2

|  | Output of First Transistor 162 | Output of Second Transistor 172 |
| --- | --- | --- |
| Voltage of Central Node A <1.4 V | On | Off |
| Voltage of Central Node A = 1.5 V | Off | Off |
| Voltage of Central Node A >1.6 V | Off | On |

Hereinafter, operations of Tables 1 and 2 will be described in detail.

If a voltage applied to the current central node A is smaller than the first external voltage (1.4 V), the first and second operational amplifiers 161 and 171 each output a low signal (refer to Table 1), and the first and second transistors 162 and 172 are respectively turned on and turned off (refer to Table 2).

Here, when the first transistor 162 is turned on, a size of the voltage applied to the central node A is increased by receiving a current from the power supply voltage VDD, as a channel is formed between the power input terminal 111 (the power supply voltage VDD) of the first IC 110 and the drain terminal (i.e., a portion of the central node A) of the first transistor 162.

If the voltage applied to the current central node A is higher than the second external voltage (1.6 V), the first and second operational amplifiers 161 and 171 each output a high signal (refer to Table 1), and the first and second transistors 162 and 172 are respectively turned off and turned on.

Here, when the second transistor 172 is turned on, the size of the voltage applied to the central node A is decreased since a current excessively flowing on the central node A is escaped to the ground source GND, as a channel is formed between the ground terminal 122 (the ground source GND) of the second IC 120 and the drain terminal (i.e., the portion of the central node A) of the second transistor 172.

Of course, when the voltage applied to the central node A is 1.5 V, the first and second operational amplifiers 161 and 172 respectively output high and low signals (refer to Table 1), and the first and second transistors 162 and 172 are both turned off (refer to Table 2). In other words, at this time, since the first and second transistors 162 and 172 are not operated, the first and second ICs 110 and 120 maintain a current state.

As described above, a current flowing through a circuit may be controlled, and a voltage may also be adjusted.

The operations of the first and second regulators 160 and 170 when the power supply voltage is divided in half to be supplied to the first and second ICs 110 and 120 are described. Hereinafter, an embodiment wherein a higher voltage is distributed to one of the first and second ICs 110 and 120 will be described.

Figure 5:
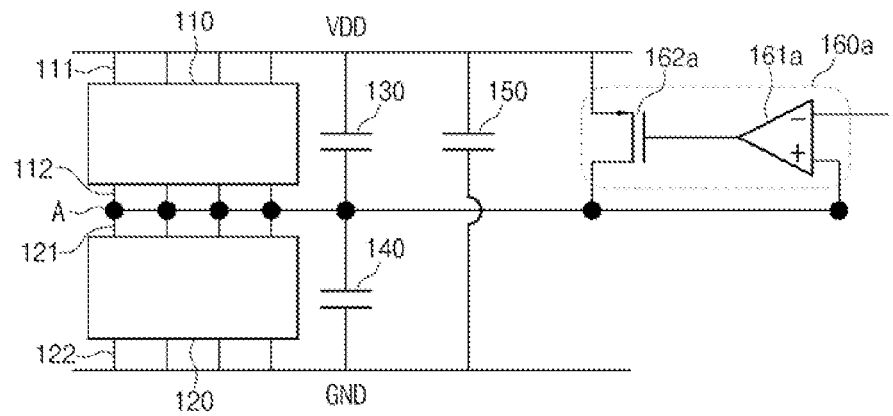
FIGS. 5 and 6 are diagrams for describing cases when only one of the first and second regulators of FIG. 4 is used.
Figure 6:
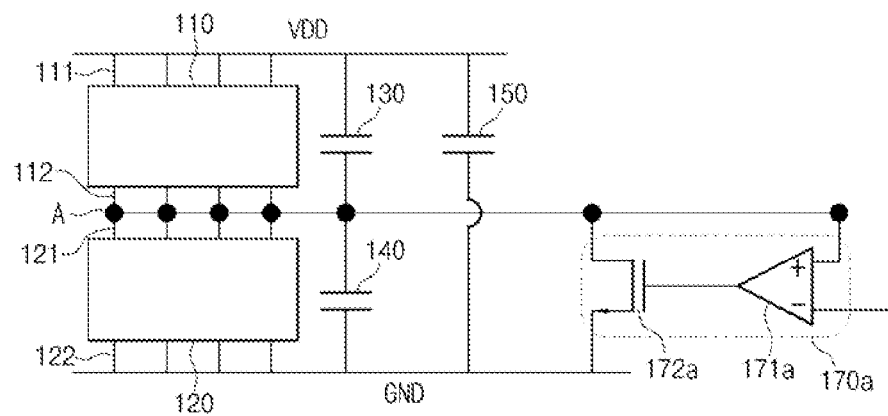

FIGS. 5 and 6 are diagrams for describing cases when only one of the first and second regulators 160 and 170 of FIG. 4 is used.

First, in FIG. 5, the second IC 120 is designed to always consume a higher current than the first IC 110, and if the first and second regulators 160 and 170 of FIG. 4 are not used, the voltage applied to the central node A always tends to be lower than 0.5 V.

In order to increase the voltage of the central node A, only a third regulator 160a having the same structure as the first regulator 160 of FIG. 4 may be used. In other words, the third regulator 160a is connected between the power input terminal 111 (the power supply voltage VDD) of the first IC 110 and the central node A.

The third regulator 160a controls the first and second voltages, which are obtained by dividing the power supply voltage VDD, to be respectively applied to the first and second ICs 110 and 120 in a uniform size, wherein the second voltage is higher than the first voltage. As described above, the second voltage is applied to the second IC 120. Accordingly, the voltage applied to the central node A is controlled to maintain a target voltage (for example, 1.6 V) higher than the half (1.5 V) of the power supply voltage VDD.

Accordingly, the third regulator 160a includes a third operational amplifier 161a and a third transistor 162a. In the third operational amplifier 161a, a third external voltage that is the same as the target voltage (1.6 V) is applied to an inverting terminal −, and a non-inverting terminal + is connected to the central node A.

The third transistor 162a is a PMOS type, has a gate terminal connected to an output terminal of the third operational amplifier 161a, has a source terminal connected to the power input terminal 111 (the power supply voltage VDD) of the first IC 110, and has a drain terminal connected to the central node A.

For example, when the voltage of the current central node A is 1.4 V that is smaller than the target voltage of 1.6 V, the third operational amplifier 161a outputs a low signal and the third transistor 162a is turned on upon receiving the low signal. When the third transistor 162a is turned on, the size of the voltage applied to the central node A is increased as described above.

In FIG. 6, the first IC 110 is designed to always consume a higher current than the second IC 120, and if the first and second regulators 160 and 170 of FIG. 4 are not used, the voltage applied to the central node A always tends to be higher than 0.5 V.

In order to decrease the voltage of the central node A, only a fourth regulator 170a having the same structure as the second regulator 170 of FIG. 4 may be used. In other words, the fourth regulator 170a is connected between the central node A and the ground terminal 122 (the ground source GND) of the second IC 120.

The fourth regulator 170a controls the first and second voltages, which are obtained by dividing the power supply voltage VDD, to be respectively applied to the first and second ICs 110 and 120 in a uniform size, wherein the first voltage is higher than the second voltage. As described above, the first voltage is applied to the first IC 110. Accordingly, the voltage applied to the central node A is controlled to maintain a target voltage (for example, 1.4 V) lower than the half (1.5 V) of the power supply voltage VDD.

Accordingly, the fourth regulator 170a includes a fourth operational amplifier 171a and a fourth transistor 172a. In the fourth operational amplifier 171a, a fourth external voltage that is the same as the target voltage (1.4 V) is applied to an inverting terminal −, and a non-inverting terminal + is connected to the central node A.

The fourth transistor 172a is an NMOS type, has a gate terminal connected to an output terminal of the fourth operational amplifier 171a, has a source terminal connected to the ground terminal 122 (the ground source GND) of the second IC 120, and has a drain terminal connected to the central node A.

For example, when the voltage of the current central node A is 1.6 V that is higher than the target voltage of 1.4 V, the fourth operational amplifier 171a outputs a high signal and the fourth transistor 172a is turned on upon receiving the high signal. When the fourth transistor 172a is turned on, the size of the voltage applied to the central node A is decreased as described above.

As described above, in the current embodiment, numbers of pins (terminals) of the first and second ICs 110 and 120 are the same, but the present invention is not limited thereto. In other words, even if the numbers of pins of the first and second ICs 110 and 120 are different, terminals corresponding to technical categories of the present invention may be connected since the first and second ICs 110 and 120 basically include power input terminals and ground terminals.

Figure 7:
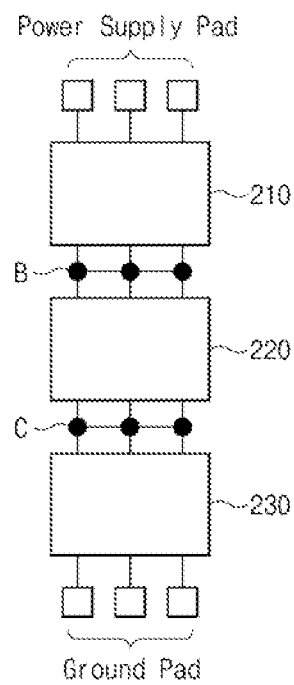
FIG. 7 is a diagram of ICs having a stacked structure, according to another embodiment of the present invention.

FIG. 7 is a diagram of ICs 210, 220, and 230 having a stacked structure, according to another embodiment of the present invention. The three ICs 210 through 230 of FIG. 7 form the stacked structure in the same manner described above with reference to FIG. 2. In FIG. 7, the ICs 210 through 230 each include three power supply pads and three ground pads. Ideally, when a power supply voltage of 3 V is applied to the power supply pads, 1 V may be applied to each of the ICs 210 through 230 according to connections of first nodes B and second nodes C.

Figure 8:
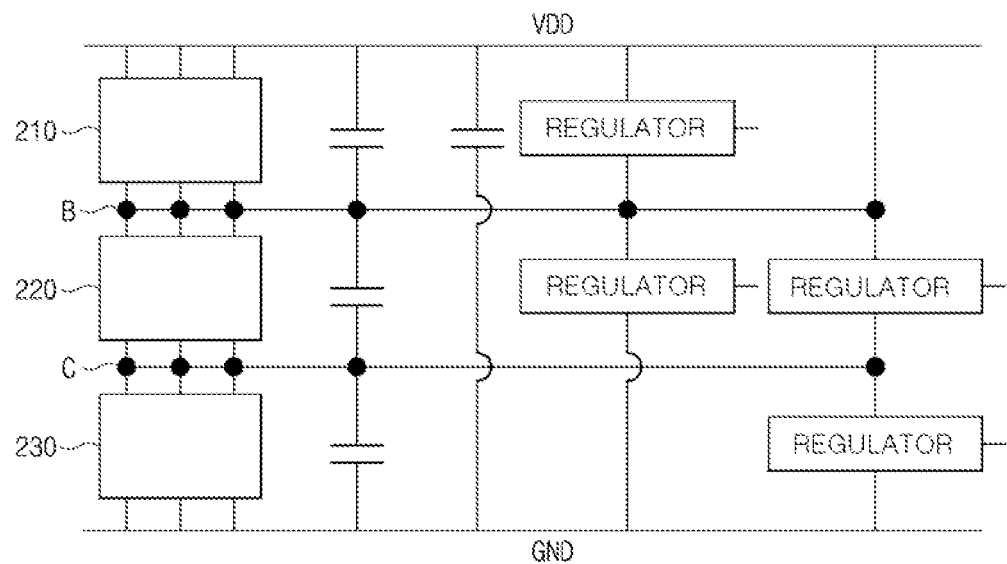
FIG. 8 is a diagram of regulators added to the ICs of FIG. 7.

FIG. 8 is a diagram of regulators added to the ICs of FIG. 7. In FIG. 8, the regulators are respectively disposed between the power supply voltage VDD and the first nodes B, between the first nodes B and the ground source GND, between the first nodes B and the second nodes C, and between the second nodes C and the ground source GND. Here, the present invention is not limited to above embodiments, and may vary within the technical categories of the present invention.

According to ICs having a stacked structure according to one or more embodiments of the present invention, the ICs may be connected in the stacked structure to reduce a number of pads and to be operable at a high power supply voltage. Also, the unit cost of production may be reduced by reducing the number of pads, and power consumption may be reduced since the ICs are operable at a low power supply voltage even when a high power supply voltage is applied.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An integrated circuit (IC) having a stacked structure, the IC comprising:
    a first IC having a power input terminal to which a power supply voltage is applied; and
    a second IC having a power input terminal connected to a ground terminal of the first IC, having a central node formed as the power input terminal of the second IC and the ground terminal of the first IC are connected to each other and to which a voltage is applied, and having a ground terminal connected to a ground source,
    wherein the power supply voltage is divided into first and second voltages that are respectively applied to the first and second ICs,
    wherein the IC further comprises first and second regulators that are respectively connected between the power input terminal of the first IC and the central node and between the power input terminal of the second IC and the central node, and control the first and second voltages to be respectively applied to the first and second ICs in a uniform size.

2. The IC of claim 1, wherein the first and second voltages are each a half of the power supply voltage.

3. The IC of claim 1, wherein the first and second regulators control the voltage applied to the central node to maintain a half size of the power supply voltage.

4. The IC of claim 3, wherein the first regulator comprises:
    a first operational amplifier having an inverting terminal to which a first external voltage smaller than a half of the power supply voltage is applied, and a non-inverting terminal connected to the central node; and
    a PMOS type first transistor having a gate terminal connected to an output terminal of the first operational amplifier, a source terminal connected to the power input terminal of the first IC, and a drain terminal connected to the central node, and
    the second regulator comprises:
    a second operational amplifier having an inverting terminal to which a second external voltage larger than the half of the power supply voltage is applied, and a non-inverting terminal connected to the central node; and an NMOS type second transistor having a gate terminal connected to an output terminal of the second operational amplifier, a source terminal connected to a ground terminal of the second IC, and a drain terminal connected to the central node.

5. The IC of claim 4, wherein, when the voltage applied to the central node is smaller than the first external voltage, the first and second operational amplifiers each output a low signal, the first and second transistors are respectively turned on and turned off, and a size of the voltage applied to the central node is increased as a channel is formed between the power input terminal of the first IC and the drain terminal of the first transistor.

6. The IC of claim 4, wherein, when the voltage applied to the central node is higher than the second external voltage, the first and second operational amplifiers each output a high signal, the first and second transistors are respectively turned off and turned on, and a size of the voltage applied to the central node is decreased as a channel is formed between the ground terminal of the second IC and the drain terminal of the second transistor.

7. The IC of claim 1, further comprising a third regulator connected between the power input terminal of the first IC and the central node to control the first and second voltages to be respectively applied to the first and second ICs in a uniform size, and controlling the central node to maintain a target voltage higher than a half of the power supply voltage,
wherein the third regulator comprises:
a third operational amplifier having an inverting terminal to which a third external voltage that is same as the target voltage is applied, and a non-inverting terminal connected to the central node; and
a PMOS type third transistor having a gate terminal connected to an output terminal of the third operational amplifier, a source terminal connected to the power input terminal of the first IC, and a drain terminal connected to the central node.

8. The IC of claim 7, further comprising:
a first capacitor disposed between the power input terminal of the first IC and the central node;
a second capacitor disposed between the central node and the ground terminal of the second IC; and
a third capacitor disposed between the power input terminal of the first IC and the ground terminal of the second IC.

9. The IC of claim 1, further comprising a fourth regulator connected between the central node and the ground terminal of the second IC to control the first and second voltages to be respectively applied to the first and second ICs in a uniform size, and controlling the central node to maintain a target voltage smaller than a half of the power supply voltage,
wherein the fourth regulator comprises:
a fourth operational amplifier having an inverting terminal to which a fourth external voltage that is same as the target voltage is applied, and a non-inverting terminal connected to the central node; and
an NMOS type fourth transistor having a gate terminal connected to an output terminal of the fourth operational amplifier, a source terminal connected to the ground terminal of the second IC, and a drain terminal connected to the central node.

10. The IC of claim 9, further comprising:
a first capacitor disposed between the power input terminal of the first IC and the central node;
a second capacitor disposed between the central node and the ground terminal of the second IC; and
a third capacitor disposed between the power input terminal of the first IC and the ground terminal of the second IC.

11. The IC of claim 1, further comprising:
a first capacitor disposed between the power input terminal of the first IC and the central node;
a second capacitor disposed between the central node and the ground terminal of the second IC; and
a third capacitor disposed between the power input terminal of the first IC and the ground terminal of the second IC.

* * * * *